United States Patent [19]

Malik et al.

[11] Patent Number: 4,503,525
[45] Date of Patent: Mar. 5, 1985

[54] COMMON CIRCUIT FOR DYNAMIC MEMORY REFRESH AND SYSTEM CLOCK FUNCTION

[75] Inventors: Ashgar K. Malik, Escondido; John A. Celio, San Diego, both of Calif.

[73] Assignee: NCR Corporation, Dayton, Ohio

[21] Appl. No.: 366,275

[22] Filed: Apr. 7, 1982

[51] Int. Cl.³ .............................................. G11C 7/00
[52] U.S. Cl. .................................................. 365/222
[58] Field of Search ................................ 365/222, 228

[56] References Cited

U.S. PATENT DOCUMENTS

| | | | |
|---|---|---|---|
| 4,084,154 | 4/1978 | Panigrahi | 365/222 |
| 4,207,618 | 6/1980 | White, Jr. et al. | 365/222 |
| 4,249,247 | 2/1981 | Patel | 365/222 X |

Primary Examiner—Joseph A. Popek
Attorney, Agent, or Firm—J. T. Cavender; Edward Dugas

[57] ABSTRACT

A time-of-day counter having a plurality of register stages for counting system clock pulses and for providing signals indicative of the status of each of the register stages is coupled by a bus to a dynamic memory of the type requiring a refresh cycle. Logic means operatively coupled to the time-of-day counter operate to pass the signals present at the output of the time-of-day registers onto the bus as memory address signals so as to effectively utilize the output signals of the time-of-day counter to periodically address all portions of the memory and to provide a refresh signal as each portion of the memory is addressed.

10 Claims, 12 Drawing Figures

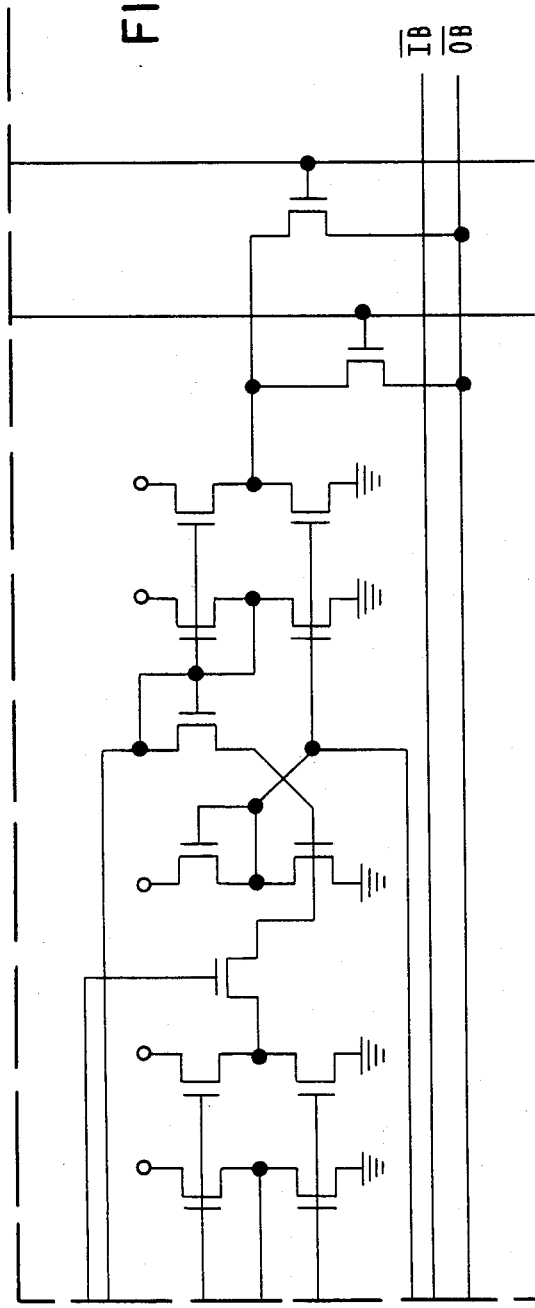

FIG. 4A

BLOCK DIAGRAM

| BITS 1-4 |
| BITS 5-8 |
| BITS 9-12 |
| BITS 13-16 |
| BITS 17-20 |
| BITS 21-24 |
| BITS 25-28 |
| BITS 29-32 |

NOTES

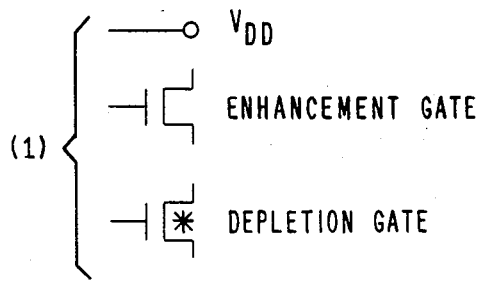

(1) { $V_{DD}$ / ENHANCEMENT GATE / DEPLETION GATE }

(2) Q1 DOES NOT APPEAR IN BITS 1,2,25,26,27,28,30,31, AND 32. (REFRESH ADDRESS IS ONLY BITS 24-03).

(3) Q1, IN BIT 29, WILL GROUND OB29 VIA RFR → MEM (X0) TO GENERATE THE REFRESH ENABLE.

(4) CELL "A" APPEARS BETWEEN BIT 16 AND 17 ONLY AS A REPOWER OF THE CARRY LOOKAHEAD CHAIN.

(5) CELL "B" APPEARS ABOVE BIT 1 AND BETWEEN BITS 4 AND 5, 8 AND 9, 12 AND 13, 16 AND 17, 20 AND 21, 24 AND 25, AND 28 AND 29.

(6) CELL "C" APPEARS BETWEEN BITS 4 AND 5, 8 AND 9, 12 AND 13, 16 AND 17, 20 AND 21, 24 AND 25, AND 28 AND 29.

(7) NODE "A" DOES NOT APPEAR IN BITS 29, 30, 31 AND 32 SINCE THERE IS NO FURTHER LOOKAHEAD BEYOND THE LAST 4-BIT BLOCK.

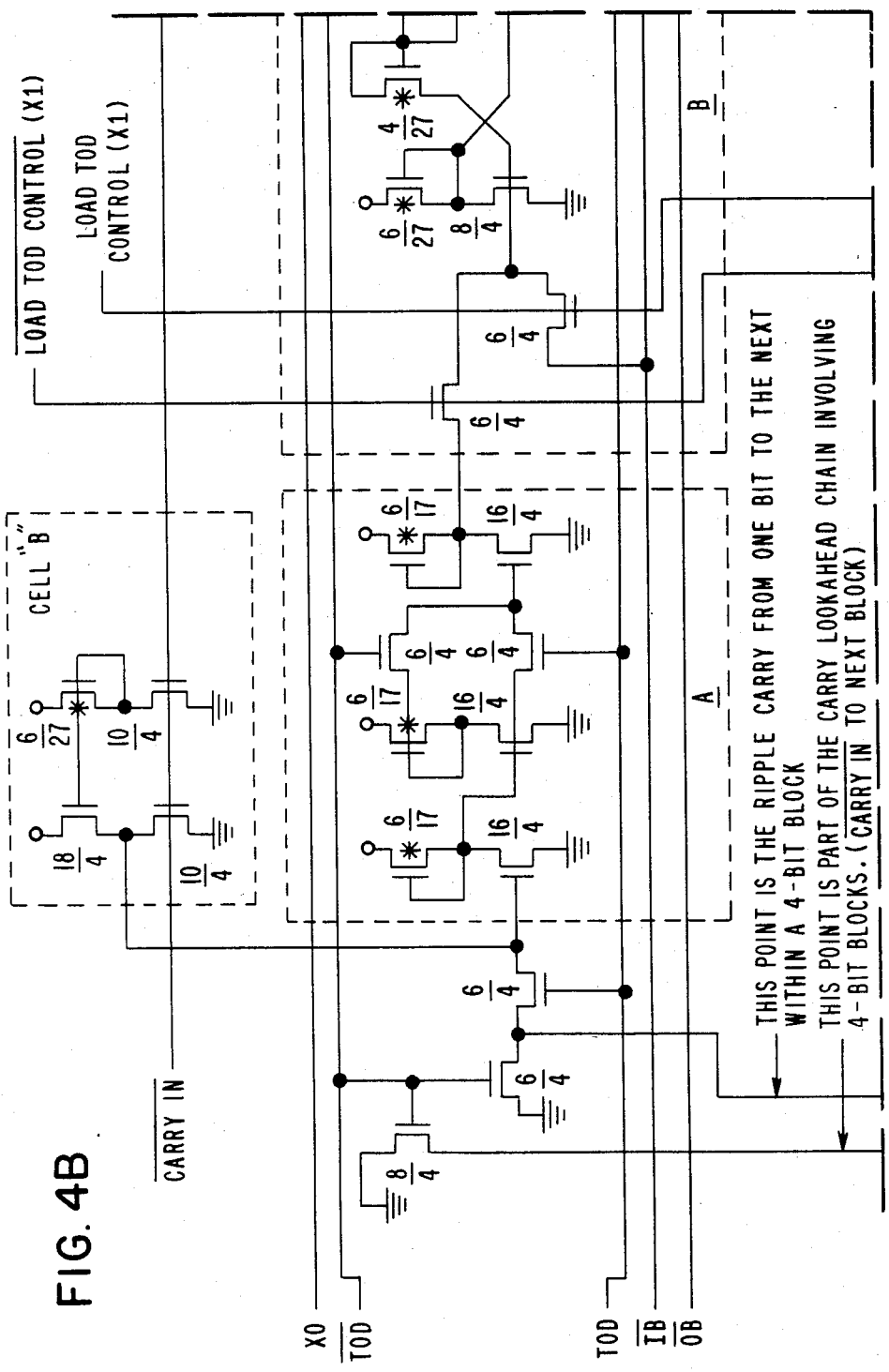

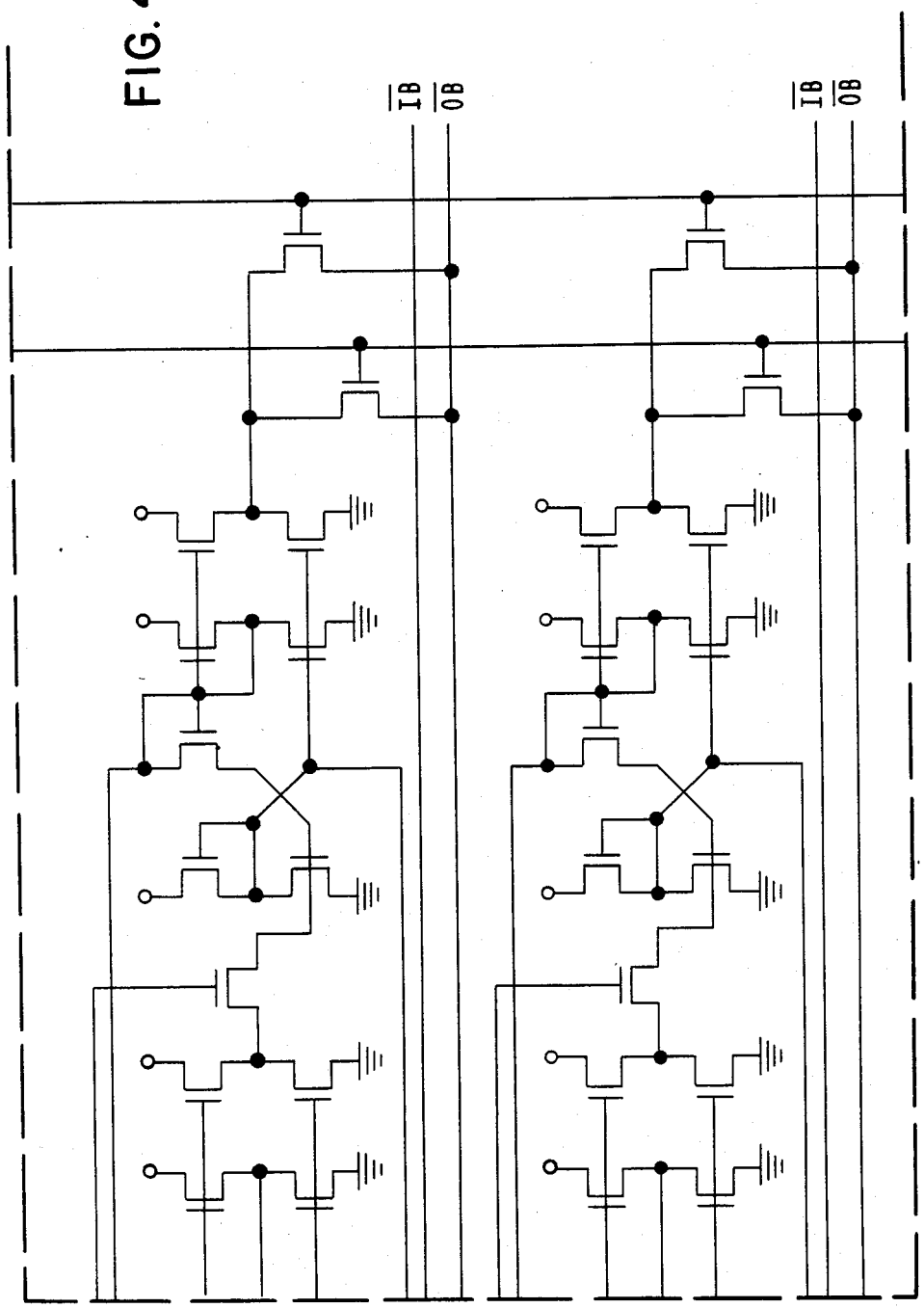

COMMON CIRCUIT FOR DYNAMIC MEMORY REFRESH AND SYSTEM CLOCK FUNCTION

BACKGROUND OF THE INVENTION

This invention relates to semiconductor memory devices and in particular to a refreshing or regeneration means for such memories.

In a competitive, cost-sensitive business such as the computer industry, the need arises to maximize the performance and functionality of a computer system while minimizing the hardware costs.

One problem common to most computer designs is that of providing a highly accurate system clock (time-of-day) mechanism which requires little processor degradation (software or firmware overhead) to maintain. For this reason, all or part of the system clock function is frequently implemented via dedicated hardware. Another common problem in computer systems which use dynamic RAM memories to implement all or part of the system memory storage is that of providing the timing generation to control the refresh operation of the RAM memory components. The reason for requiring memory refresh is that dynamic memory cells store information as a function of electrical charge on a capacitor. A capacitor is a dynamic device in that the charge, representing the information stored, quickly dissipates. In prior art systems, the memory refresh is accomplished by having; a counter which provides the refresh address, and a system interrupt mechanism which allows the refresh to occur, all operating in conjunction with a timer to indicate when the refresh should occur. As previously stated, the cost of this circuitry in a competitive climate urges a solution which would eliminate this additional hardware cost.

Patents representing the state of memory refreshing known to the inventor at the time of filing this application are as follows:

U.S. Pat. No. 3,684,897 entitled "Dynamic MOS Memory Array Timing System" by S. R. Anderson; U.S. Pat. No. 4,079,462 entitled "Refreshing Apparatus for MOS Dynamic RAMs" by J. T. Koo; U.S. Pat. No. 4,207,618 entitled "On-Chip Refresh for Dynamic Memory" by L. S. White, Jr. et al.; and U.S. Pat. No. 4,249,247 entitled "Refesh System for Dynamic RAM Memory" by N. M. Patel.

In light of the present solutions to the refresh problem, the present invention is directed to the utilization of the real time system clock circuitry for a dual purpose, that is, for refresh address building in the RAS only (Row Address) type of refresh operation and for the basic operation of providing a time-of-day counter.

SUMMARY OF THE INVENTION

In the present invention a dynamic memory (RAM) is coupled, by means of a bus to a counter which functions as a time-of-day (TOD) counter. The counter is adapted to count system clock signals. Logic means are operatively coupled to the counter to request bus access each refresh cycle. Means are provided for enabling the memory when access is granted such that the outputs of the time-of-day counter are applied to the bus to address portions of the memory and to provide a refresh enable signal.

From the foregoing it can be seen that it is an object of the present invention to provide a simplified and improved refresh control circuit for a dynamic memory by utilizing the time-of-day counter for the refresh address generation.

This and other objects of the present invention will become more apparent when taken in conjunction with the following description and drawings wherein like characters indicate like parts and which drawings form a part of the present specification.

BRIEF DESCRIPTION OF THE DRAWINGS

FIGS. 4A through 4G are transistor level schematics of four register sections used in the time-of-day counter of the preferred embodiment of the invention.

DESCRIPTION OF THE PREFERRED EMBODIMENT OF THE INVENTION

Figure 1:
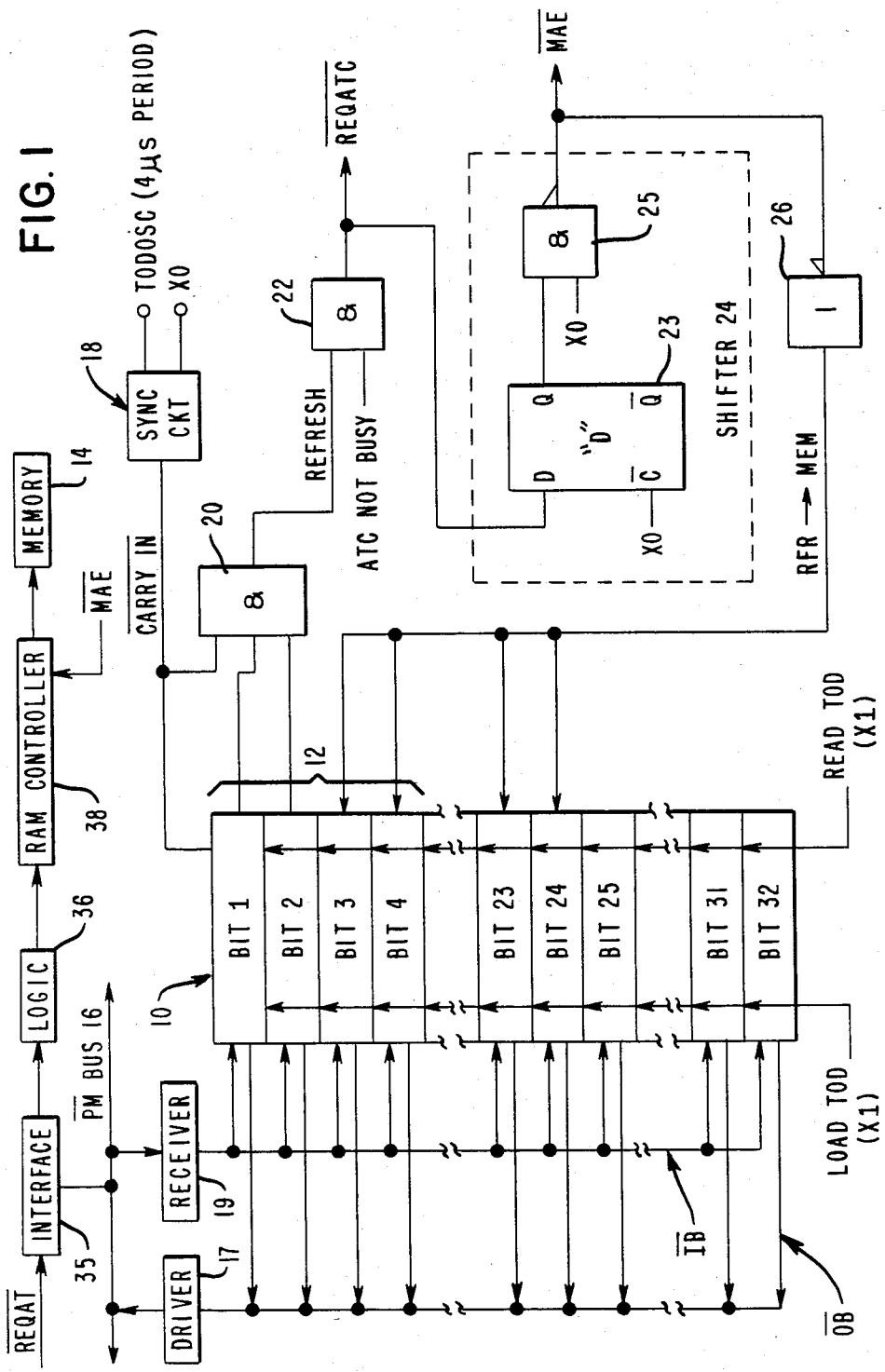
FIG. 1 is a block diagram, partially in logic level form, of the preferred embodiment of the invention.
Figure 6:
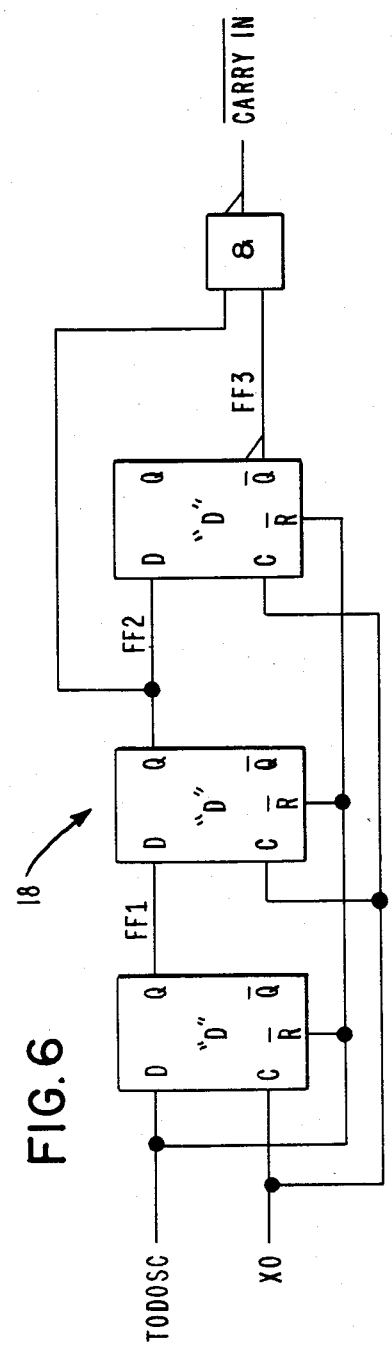
FIG. 6 is a logic block schematic of a circuit used in the preferred embodiment of FIG. 1.

Referring to FIG. 1, a 32 bit time-of-day counter 10 is shown comprised of eight, two stage, 4 bit registers 12. The counter may be parallel loaded or serially stepped (incremented). For parallel loading the signals on lines $\overline{IB}$ are latched into the associated bit stages, generally for initialization purposes. The output signals available at the output of each bit stage are applied to the lines $\overline{OB}$. The $\overline{OB}$ lines and $\overline{IB}$ lines are connected to a $\overline{PM}$ bus 16 through conventional driver circuits 17 and receiver circuits 19, respectively. Also operatively connected to the $\overline{PM}$ bus is a dynamic memory 14. The dynamic memory 14, in the preferred embodiment of the invention, was a RAM type memory comprised of an array of memory chips. Logic 36, RAM controller 38 and interface 35 perform the actual hardware connection of the memory 14 to the $\overline{PM}$ bus 16. One input to the counter 10, labeled CARRY IN, is connected to the Bit 1 stage, from the output of a sync circuit 18. The sync circuit 18 used in the preferred embodiment of the invention is shown in FIG. 6. The counter 10 is clocked in the increment mode whenever the CARRY IN signal is activated (set low). The inputs to the sync circuit 18 are a TODOSC signal, having a repetition rate of approximately 4 microseconds, and a signal $X_0$. The CARRY IN signal is a low level pulse, one processor clock period in duration. The processor cycle for the system in which this invention was implemented utilizes two subclocks $X_0$ and $X_1$ which are of equal width and are non-overlapping. An AND gate 20 receives as its inputs the CARRY IN signal and the outputs of the Bit 1 and Bit 2 stages of counter 10. These logical gated signals result in the signal REFRESH which is applied as an input to an AND gate 22. An additional input to the AND gate 22 is the ATC NOT BUSY signal which, when active, gates the REFRESH signal to the output of the AND gate 22. The gated REFRESH signal is designated the $\overline{REQATC}$ signal. The purpose of $\overline{REQATC}$ is to request and reserve the $\overline{PM}$ Bus for the transfer of the refresh message. This signal is also directed to the input of a 1 cycle shifter 24. Shifter 24 consists of a D-type flip-flop 23 and a NAND gate 25. The signal $X_0$ clocks and gates elements 23 and 25, respectively. The output of shifter 24, designated $\overline{MAE}$, is a memory address enable signal directed to the RAM controller 38. $\overline{\text{MAE}}$ is also routed through inverter 26 to produce the signal designated RFR→MEM, which is directed to the Bits stage 3–24 of counter 10. Additional inputs to the time-of-day counter are the LOAD TOD ($X_1$) and READ TOD ($X_1$) signals ($X_1$ is the sub-clock signal referred to above).

Figure 2:
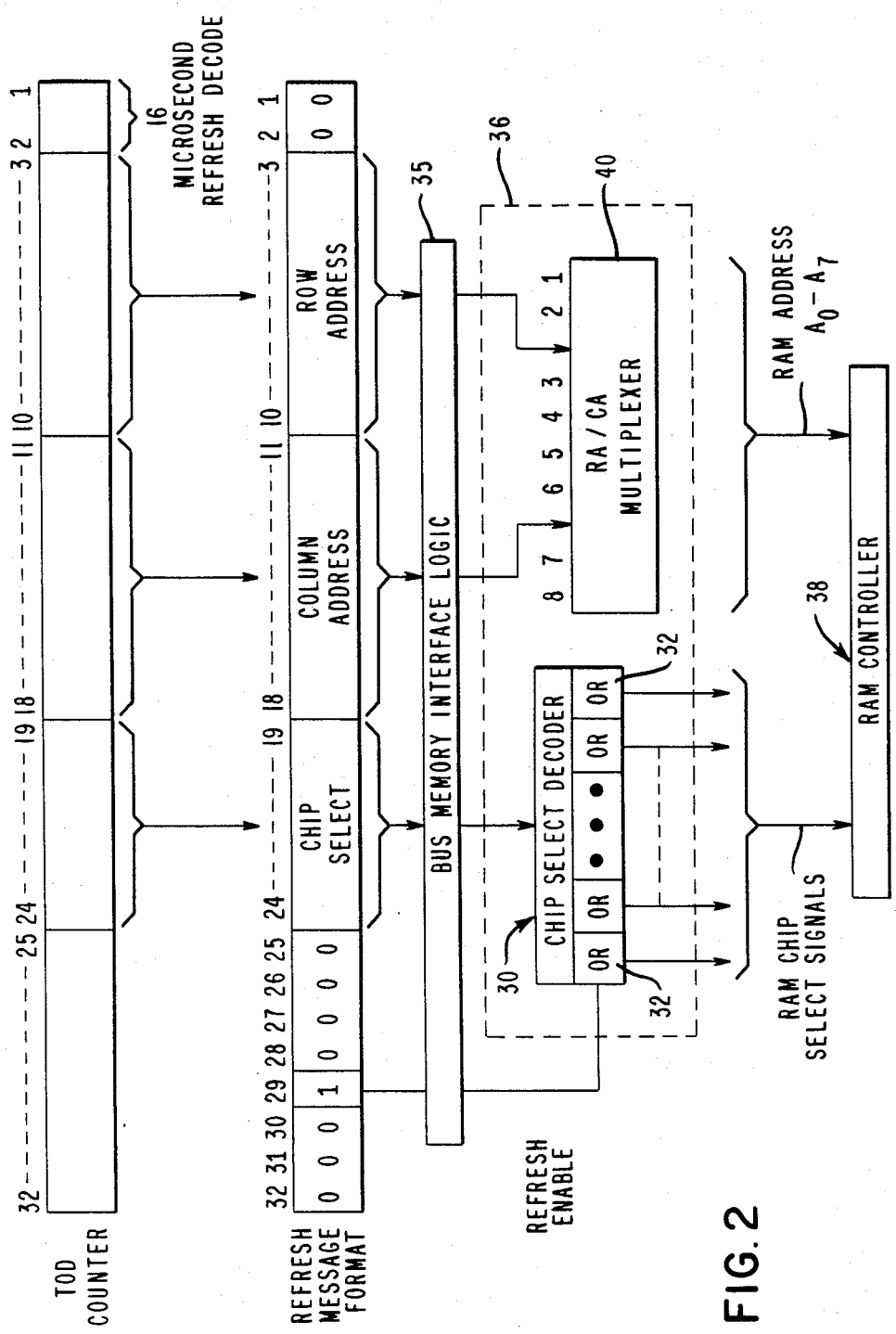
FIG. 2 illustrates the relationship of the bits from the time-of-day counter and the bits used for the memory refresh interfacing with associated memory hardware.

Referring now to FIG. 2, the 32 bit stages of the time-of-day counter 10 have their respective bits symbolized by the blocks labeled 1–32. The relationship of these bits to the refresh memory message is shown in the blocks labeled 1–32. In the preferred embodiment, Bits 1–2 of the TOD counter define the message generation rate which is referred to as the 16 microsecond refresh decode. Bits 3–10 are utilized as the row address and bits 11–18 are utilized as the column address. In the RAS the only type of Refresh described in this invention only the Row Address is required. The TOD Counter value transferred provides Column Address information should a Read/Modify/Write type of Refresh be desired in which case both Row and Column Addresses are required. The bit 29 in the refresh message is the bit that enables all chips within the memory array to receive the refresh row address (RA).

Figure 5:
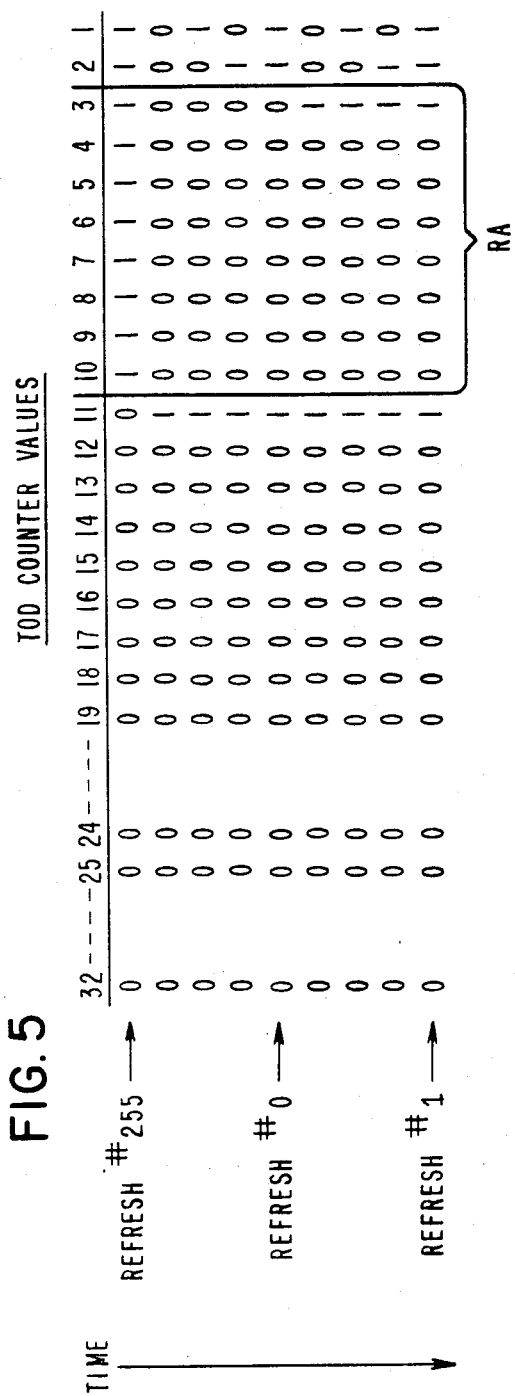
FIG. 5 is a table illustrating bit values.

In FIG. 5 the value in the TOD counter is shown after successive increment periods (4 microseconds apart). When TOD bits 2, 1 are both ones then a Refresh will occur (Refreshes are 16 microseconds apart).

The value in the complete TOD counter represents a binary equivalent to the time-of-day. The value in bits 10–03 will be used as the row address to the dynamic memories. As can be seen, bits 10–03 will provide a unique address at each refresh period. At the first refresh (number 225) shown, the last row of cells in the RAMs will be refreshed because the all ones in bits 10–'will decode as row 225. At the second refresh (number 0) the very first row of cells will be refreshed because the all zeros will decode as row 0.

As the TOD counter keeps incrementing, bits 10–03 will cycle through all combinations every 16 microseconds×256 rows which equals 4 milliseconds. Carry-out terms from bit 10 propagate up through the TOD counter to maintain the proper time-of-day but are transparent to the needs of the refresh operation which only uses the row address obtained from counter bits 10–03.

On standard memory operations or Read/Modify/Write type Refreshes the row address from bits 10–03 of the memory message are multiplexed, by a multiplexer 40, with the column address bits 18–11 to form the actual RAM Address $A_0$–$A_7$ inputs. The row address bits are first strobed into the RAM and then the multiplexer is switched to the column address signals and then they are strobed into the RAM. In this way each storage cell in the RAM receives 16 address bits which are used to select one of 64K ($2^{16}$) cells.

During a RAS only refresh operation the row address must be applied to all chips within the complete memory array. Note that on a standard memory operation only a subset of the chips are selected (receive the memory control signals) on a given memory reference. If the memory word size is 32-bits in length then only 32 RAM chips will have their chip select inputs activated. This chip selection is determined by decoding the upper memory address bits which are not involved in the actual RAM address input generation (bits 24–19). A chip select decoder 30 along with a plurality of "OR" gates 32 performs this function. During a RAS only refresh operation the Refresh Enable bit (29), in the refresh message, will be on to enable all chip selects, through "OR" gates 32, while the row address RA is applied to the RAM chips. When the next memory message, that is a non-refresh message, is received at the memory interface the Refresh bit 29 will be off and the chip select decoder 30 will produce a single chip select for a single memory word.

The multiplexer 40 and chip select decoder 30 are implemented with standard off-the-shelf components and are common to any memory interface design using dynamic RAM memories.

In the preferred embodiment of the invention the bus memory interface logic 35 is an SN74LS373 Integrated Circuit (IC) manufactured by Texas Instruments; the chip select decoder 30 is an SN74LS138 manufactured by Texas Instruments; the multiplexer 40 is a two-quad multiplexer SN74LS257 manufactured by Texas Instruments and the RAM memory 14 is a 64K memory of the type manufactured by Motorola (MCM6665A), Fujitsu (MB-8264) and IMOS, (IMS2600). The RAM Controller 38 in FIG. 2 is of the type manufactured by National Semiconductor bearing their part number DP8408.

To be noted in the FIG. 2 diagram is that the eight bit row and column addresses correspond to the requirements of a 64K×1 dynamic RAM chip. It should be readily understood that the diagram can be scaled down to seven bit row and column addresses when using a 16K×1 dynamic RAM chip.

Figure 3:
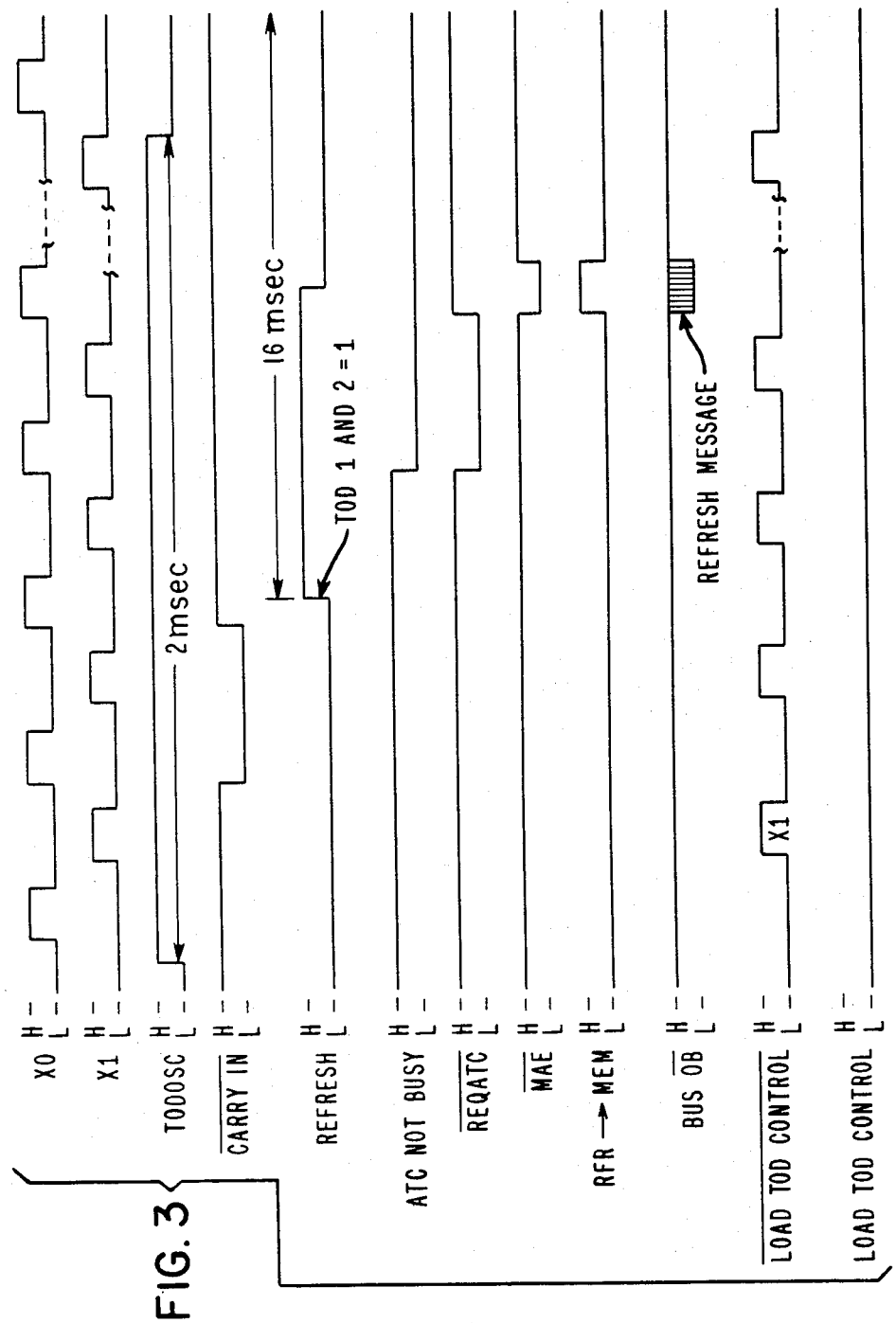
FIG. 3 is a timing diagram useful in understanding the operation of the preferred embodiment of FIG. 1.
Figure 4C:
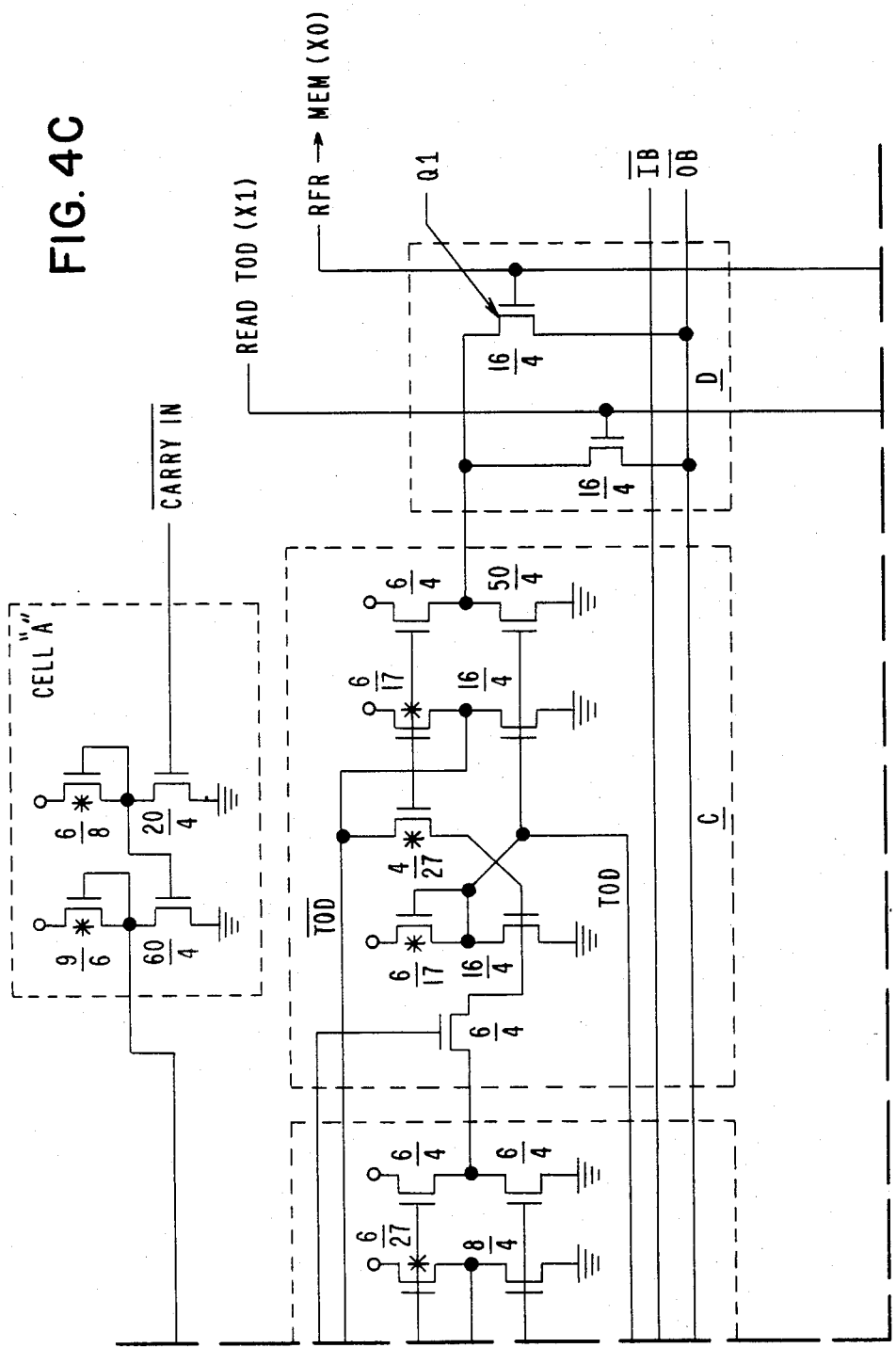
Figure 4D:
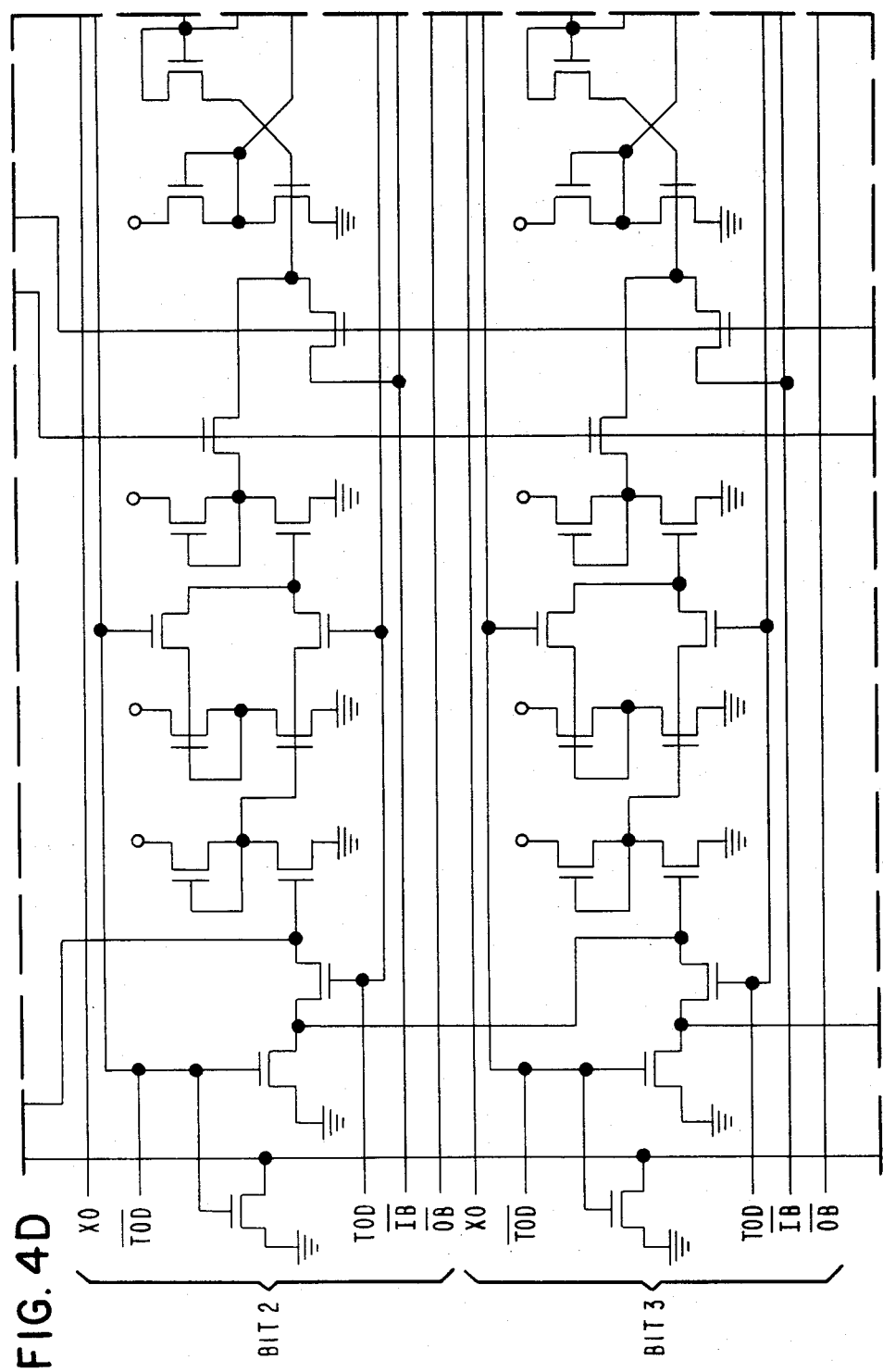
Figure 4F:
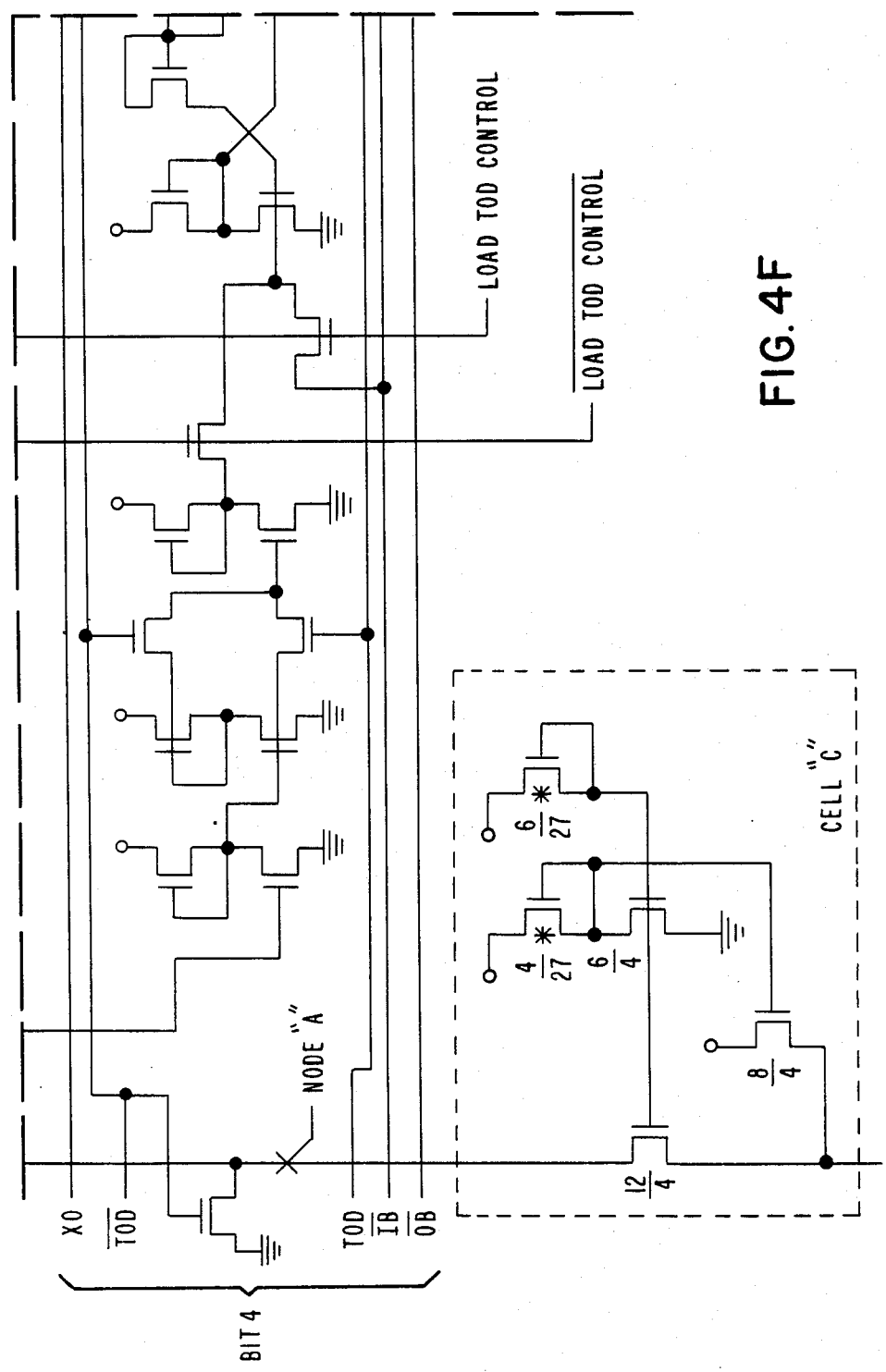

Referring now to the waveforms of FIG. 3, in the preferred embodiment of the invention, the processor cycle for the system is implemented with two sub-clocks, $X_0$ and $X_1$, which are of equal width and are non-overlapping. The TODOSC signal input to the sync circuit 18 is a square wave consisting of equal 2 microsecond on and off periods. A 4 microsecond rate was chosen to provide adequate resolution for the low order bits of the time-of-day clock and, more importantly, to establish the refresh decode (TOD bits 2 and 1 true) at a 16 microsecond period. A typical 64K×1 dynamic RAM memory chip requires each row of storage cells, within the RAM, to be refreshed once every four milliseconds, plus or minus some tolerance. A 64K×1 memory with 256 rows must have all rows refreshed within 4 milliseconds, which if each row is refreshed individually every 16 microseconds, amounts to 4.096 milliseconds which is within chip specifications. During the $X_1$ clock labeled 2 the presence of the CARRY-IN term allows the counter 10 to increment. The result of the incrementation is latched into the second stage of the two-stage counter by the $X_0$ pulse labeled 3. The stages of the counter are disclosed in detail in FIG. 4. If both TOD bit 2 and TOD bit 1 are true, then the signal REFRESH is activated (goes high). If the bus is not busy, the REFRESH signal is gated with the ATC NOT BUSY term and an $\overline{\text{REQATC}}$ signal is activated. The $\overline{\text{REQATC}}$ signal gains access onto the processor memory bus $\overline{\text{PM}}$ BUS. This bus interfaces the output of the time-of-day counter to the memory interface logic. With access to the bus in the cycle following $\overline{\text{REQATC}}$, the signal $\overline{\text{MAE}}$ is activated, as a control, to alert the memory interface that refresh data is being transferred onto the $\overline{\text{PM}}$ BUS. The signal RFR MEM gates the contents of the time-of-day bits 24–3 onto the $\overline{\text{PM}}$ BUS. Bit 29 is the special bit which designates the message to be a refresh message instead of a normal memory access. Both $\overline{\text{MAE}}$ and RFR MEM are generated as signals delayed by one cycle from the $\overline{\text{REQATC}}$ term. This one cycle delay is accomplished by the shifter 24. The refresh message is shown as the signal $\overline{OB}$. The LOAD TOD control signal is equal to $X_1$ during non-parallel loading. Parallel loading of the TOD counter 10, during initialization, is commenced by pulsing LOAD TOD control high.

Referring now to FIGS. 4A through 4G, which show, in transistor level form, eight two stage 4 bit cascaded counters, which make up the time-of-day counter 10. The ratio of the gates are shown only for the first bit row of transistors. All of the remaining rows are identical in ratio construction and will not be shown for purposes of simplicity. Each of the input and output lines labeled in FIGS. 4B through 4G find a corresponding match in the block diagram of FIG. 1 so as to show one preferred complete detailed embodiment of the present invention. The operation of a 4 bit cascaded counter is well-known to those persons skilled in the art and will not be described in detail, again for purposes of simplicity. A single bit slice of the counter 10 will be discussed for detailing the components producing the two-stage effect and for the interaction of the control signals in this bit slice with the signals shown in FIG. 1 and FIG. 3.

A single bit slice of the TOD counter has four major components labeled A through D. Section A if it is the first bit of a 4-bit block receives the CARRY IN term. The CARRY IN signal is passed to the next bit in the block if the TOD bit in this slice is true. Section A performs the increment function if the equivalent CARRY IN is active to the section A logic.

Section B is the first stage latch in the TOD counter. This latch accepts inputs from two sources, section A when the counter is in a non-load mode (LOAD TOD CONTROL pulsed high at X1) or from the $\overline{IB}$ Bus when in the load mode (LOAD TOD CONTROL Pulsed high at X1). This latch provides a stable input to the second stage latch which sources the primary signals TOD and $\overline{TOD}$.

Section C, the second stage latch, loads from section B every $X_0$. Section C provides stable inputs to section A during the increment operation.

Section D consists of two transfer gates to source the contents of the TOD counter onto the $\overline{OB}$ Bus during reads of the TOD (READ TOD active at X1) or during refresh operations when the TOD contents are sent to the memory interface (RFR MEM active at $X\phi$).

Referring to FIG. 6 the sync circuit 18 is shown comprised of three D-type flip-flops connected in series. The output of the second and last flip-flop taken from the Q and the $\overline{Q}$ outputs, respectively are directed as inputs to the NAND gate. The output of the NAND gate is the signal CARRY IN.

From the foregoing description it can be seen that a system has been disclosed for refreshing a dynamic type memory which system takes advantage of the availability of a time-of-day counter.

While there has been shown what is considered to be the preferred embodiment of the invention, it will be manifest that many changes may be made therein without departing from the spirit of the invention. It is intended, therefore, in the annexed claims to cover all such changes and modifications as may fall within the true scope of the invention.

We claim:

1. A circuit for refreshing a dynamic memory comprising:
    a multi-stage binary counter for providing output bits corresponding to memory addresses and a cumulation count equivalent to the elapsed pulses of a systems clock, and
    refresh message generating means operatively coupling said binary counter to said dynamic memory for generating a refresh message, said refresh message generating means including addressing means for addressing said memory at an address specified by said output bits such that said refresh meassage is applied at said address so as to refresh said memory.

2. The circuit according to claim 1 wherein said refresh message generating means is comprised in part of:
    first logic means responsive to said output bits for enabling said refresh message generating means thereby timing said refresh message for said memory.

3. The circuit according to claim 2 wherein said refresh message generating means is further comprised of:
    second logic means for providing an enabling signal to said memory usable by said memory for enabling said memory to receive said refresh message, and said addressing means includes means for establishing selected ones of said output bits as memory addresses.

4. The circuit according to claim 2 wherein said addressing means further comprises:
    decoder means for decoding selected ones of said output bits as a function of the output bits for use as memory addresses.

5. A circuit for refreshing a memory, said memory having a plurality of memory portions each comprised of a multiplicity of memory elements arranged in rows and columns, said memory particularly adapted for use in a computing system having a bus and a source of timing pulses, said circuit comprising:
    a timing pulse counter for counting timing pulses from said source of timing pulses and providing output signals corresponding to the number of pulses counted;
    said timing pulse counter being connected to said bus for transmitting said output signals to said memory;
    first logic means coupled to said counter for providing a bus request signal usable by said computing system for controlling access to said bus for the transmission of said output signals to said memory;
    second logic means for providing a memory enabling signal to said memory for enabling said memory upon the granting of said bus access, and having gate means for gating select ones of the output signals of said timing pulse counter onto said bus as memory addresses; and
    decoder means coupled to said bus for receiving said gated output signals and directing a refresh enable signal to the memory portion addressed by said gated output signals.

6. The circuit according to claim 5 wherein said timing pulse counter includes a shift register having a plurality of stages, each stage for containing a binary bit of the value representative of the counted timing pulses; and
    wherein said first logic means is comprised of:
    a first AND gate receiving as inputs the binary bits from the first two stages of said shift register and the timing pulses; and
    a second AND gate receiving as inputs the output from said first AND gate and a signal indicating the busy status of said bus to provide at its output said bus request signal.

7. The circuit according to claim 5 wherein said second logic means is a one cycle shifter comprised of:
a flip-flop for receiving at one input said bus request signal and providing at its output a flip-flop output signal responsive to said bus request signal; and
gating means coupled to the output of said flip-flop for gating said flip-flop output signal to said bus after a desired delay.

8. The circuit according to claim 7 wherein said timing pulse counter includes a 32-bit register for providing binary signals having a plurality of bits numbered from 1 through 32, said binary signals corresponding to the time-of-day and wherein bits numbered from 3 through 10 are further used as a portion of said memory address indicative of the memory row address, bits numbered from 11 through 18 are used as a portion of said memory address indicative of the memory column address, bits numbered from 19 through 24 are used as a memory portion select signal and bit numbered 29 is used as said refresh enable signal.

9. The circuit according to claim 8 and further comprising:
a multiplexer coupled to said bus and to said memory for alternately providing said row address and said column address to said memory.

10. The circuit according to claim 9 wherein said decoder is coupled to said bus and to said memory for applying said refresh enable signal to the memory portion indicated by said row and column addresses.

* * * * *